US012805168B2

(12) United States Patent
Yang et al.

(10) Patent No.: US 12,805,168 B2
(45) Date of Patent: Nov. 17, 2026

(54) FOLDABLE DISPLAY APPARATUS

(71) Applicant: LG Display Co., Ltd., Seoul (KR)

(72) Inventors: SeungSoo Yang, Paju-si (KR); JuHun Min, Paju-si (KR); SunWoong Kim, Paju-si (KR); DongUk Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 301 days.

(21) Appl. No.: 18/790,978

(22) Filed: Jul. 31, 2024

(65) Prior Publication Data

US 2025/0048900 A1 Feb. 6, 2025

(30) Foreign Application Priority Data

Jul. 31, 2023 (KR) ........................ 10-2023-0099854

(51) Int. Cl.
*H10K 59/80* (2023.01)
*H10K 102/00* (2023.01)

(52) U.S. Cl.
CPC ..... *H10K 59/879* (2023.02); *H10K 2102/311* (2023.02)

(58) Field of Classification Search
CPC ........................ H10K 59/879; H10K 2102/311
See application file for complete search history.

(56) References Cited

U.S. PATENT DOCUMENTS

2023/0317894 A1* 10/2023 Nakamura ......... G02B 27/0172 257/98
2024/0196711 A1* 6/2024 Nozaki ............... H10F 39/8063
2024/0357909 A1* 10/2024 Sano .................... H10K 59/879
2025/0221276 A1* 7/2025 Baek ...................... H10K 59/40

FOREIGN PATENT DOCUMENTS

KR 10-2498948 B1 2/2023
KR 10-2023-0067794 A 5/2023

* cited by examiner

*Primary Examiner* — Richard A Booth
(74) *Attorney, Agent, or Firm* — Birch, Stewart, Kolasch & Birch, LLP

(57) ABSTRACT

A foldable display apparatus in one example includes a display panel having folding area and non-folding area, and a light guide member disposed on the display panel and including the folding area and the non-folding area. The light guide member includes a plurality of first lens patterns disposed in the non-folding area, a first filling layer disposed in the non-folding area and disposed on the plurality of first lens patterns, and an intermediate layer disposed in the folding area. A difference between a modulus of an upper surface of the intermediate layer and a modulus of a lower surface of the intermediate layer is smaller than a difference between a modulus of the plurality of first lens patterns and a modulus of the first filling layer.

31 Claims, 8 Drawing Sheets

FOLDABLE DISPLAY APPARATUS

CROSS-REFERENCE TO RELATED APPLICATIONS

This application claims priority to Korean Patent Application No. 10-2023-0099854 filed in the Republic of Korea on Jul. 31, 2023, the entire contents of which is hereby expressly incorporated by reference into the present application.

BACKGROUND

Field

The present disclosure relates to a foldable display apparatus in which internal light extraction efficiency is increased, reflectance by external light is reduced, and stress generated during folding is relieved.

Discussion of the Related Art

As the information society develops, demands for display devices are also developing in various forms. In response, various flat panel display devices such as a liquid crystal display (LCD), an organic light emitting display (OLED), and a micro light emitting diode (LED) display have been developed in recent years.

In particular, a foldable display or a rollable display using the advantages of a flexible display panel that can be bent or folded is in the spotlight as a next-generation technology in the display device field because it can provide a large screen display while maintaining convenience of portability.

Flexible display devices can be applied to portable electronic devices such as mobile communication terminals, electronic notebooks, electronic books, PMP (Portable Multimedia Player), navigation, UMPC (Ultra-Mobile PC), mobile phones, smart phones, and tablet PCs. It can also be applied to various fields such as television, monitors, and instrument panels of automobiles.

The foldable display device is folded to have a small area when carried, and has the advantage of being able to use a wide display area by unfolding it when used. Meanwhile, since the foldable display device repeats the operation of folding and unfolding multiple times, damage can occur more easily than other display devices. Thus, there is a need for structural improvement that does not cause damage even when used for a long time by alleviating folding stress and/or bending stress which can be caused by repeating such folding and unfolding operations.

SUMMARY OF THE DISCLOSURE

The present disclosure has been made in view of the above issues and other limitations associated with the related art, and it is an object of the present disclosure to provide a foldable display apparatus that includes a plurality of lens patterns capable of minimizing or reducing the occurrence of Rainbow Mura and Ring Mura phenomena due to reflection of external light, and can suppress the occurrence of peeling in a folding area during folding due to a modulus difference of a material.

In accordance with an aspect of the present disclosure, the above and other objects can be accomplished by the provision of a foldable display apparatus comprising a display panel including a folding area and a non-folding area, and a light guide member disposed on the display panel and including the folding area and the non-folding area, wherein the light guide member includes a plurality of first lens patterns disposed in the non-folding area, a first filling layer disposed in the non-folding area and disposed on the plurality of first lens patterns, and an intermediate layer disposed in the folding area, wherein a difference between a modulus of an upper surface of the intermediate layer and a modulus of a lower surface of the intermediate layer is smaller than a difference between a modulus of the plurality of first lens patterns and a modulus of the first filling layer.

Furthermore, the above and other objects can be accomplished by the provision of a foldable display apparatus comprising a display panel including a folding area and a non-folding area, and a light guide member disposed on the display panel and including the folding area and the non-folding area, wherein the light guide member includes a plurality of first lens patterns disposed in the non-folding area, a first filling layer disposed in the non-folding area and disposed on the plurality of first lens patterns, and an intermediate layer disposed in the folding area, wherein the intermediate layer includes a continuous area having a same modulus from an upper surface of the light guide member to a lower surface of the light guide member.

BRIEF DESCRIPTION OF THE DRAWINGS

The above and other objects, features and other advantages of the present disclosure will be more clearly understood from the following detailed description taken in conjunction with the accompanying drawings, in which:

FIG. 4 is a view illustrating a state in which the folding area of FIG. 3 is folded.

FIG. 8 is a view illustrating a state in which the folding area of FIG. 7 is folded.

FIG. 10 is a view illustrating a state in which the folding area of FIG. 9 is folded.

FIG. 12 is a cross-section taken along line III-III' illustrated in FIG. 11.

DETAILED DESCRIPTION OF THE EMBODIMENTS

Figure 1:
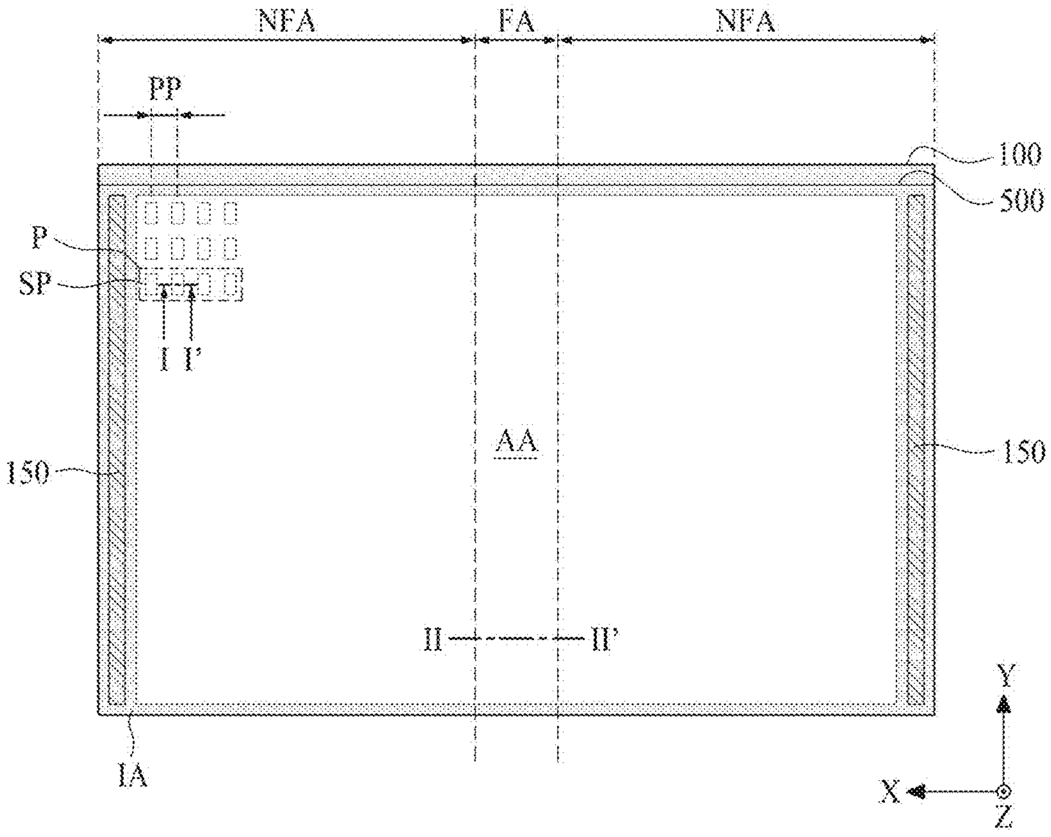
FIG. 1 is a plan view of a foldable display apparatus according to an embodiment of the present disclosure.

Advantages and features of the present disclosure, and implementation methods thereof will be clarified through the following embodiments, described with reference to the accompanying drawings. The present disclosure can, however, be embodied in different forms and should not be construed as being limited to the embodiments set forth herein. Rather, these embodiments are provided so that this disclosure will be thorough and complete, and will fully convey the scope of the present disclosure to those skilled in the art.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present disclosure are used, another part can also be present unless "only" is used. The terms in a singular form can include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween can be included, unless "just" or "direct" is used.

If it is mentioned that a first element is positioned "on" a second element, it does not mean that the first element is essentially positioned above the second element in the figure. The upper part and the lower part of an object concerned can be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous can be included, unless "just" or "direct" is used.

It will be understood that, although the terms "first," "second," etc. can be used herein to describe various elements, these elements should not be limited by these terms. These terms are only used to distinguish one element from another and may not define order or sequence. For example, a first element could be termed a second element, and, similarly, a second element could be termed a first element.

It should be understood that the term "at least one" includes all combinations related with any one item. For example, "at least one among a first element, a second element and a third element" can include all combinations of two or more elements selected from the first, second and third elements as well as each element of the first, second and third elements.

Features of various embodiments of the present disclosure can be partially or overall coupled to or combined with each other, and can be variously inter-operated with each other and driven technically. The embodiments of the present disclosure can be carried out independently from each other, or can be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode can be the drain electrode, and the drain electrode can be the source electrode. Further, the source electrode in any one embodiment of the present disclosure can be the drain electrode in another embodiment of the present disclosure, and the drain electrode in any one embodiment of the present disclosure can be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region can be a source electrode, and a drain region can be a drain electrode. Further, a source region can be a drain electrode, and a drain region can be a source electrode.

In the present application, all components of each foldable display device according to all embodiments of the present disclosure are operatively coupled and configured.

FIG. 1 is a plan view of a foldable display apparatus according to an embodiment of the present disclosure.

As shown in FIG. 1, the foldable display apparatus according to an embodiment of the present disclosure can include a display panel including a first substrate 100 and a second substrate 500 opposite to the first substrate 100 and bonded to each other.

The first substrate 100 can include a thin film transistor and can be a transparent glass substrate or a plastic substrate. The first substrate 100 can include a display area (or active area) AA in which an image is displayed and a non-display area (or inactive area) IA in which an image is not displayed according to whether an image is displayed by a pixel.

The display area AA can be an area in which an image is displayed, and can be a pixel array area, an active area, a pixel array unit, a display unit, or a screen. The display area AA can include a plurality of pixels P.

The plurality of pixels P can be disposed along each of a first direction (e.g., X) and a second direction (e.g., Y) crossing the first direction X. Each of the plurality of pixels P can be a unit region in which actual light is emitted. For example, the plurality of pixels P can be disposed to have a pixel pitch PP along the first direction X. The pixel pitch PP can be a size of each of the plurality of pixels P with respect to the first direction X, a distance between one side of each of two pixels P adjacent along the first direction X, or a distance between central portions of two pixels P adjacent along the first direction X.

Each of the plurality of pixels P can include a plurality of adjacent sub-pixels SP. For example, the plurality of sub-pixels SP can constitute the plurality of pixels P. For example, the first direction X can be a first length direction, a long side length direction, a horizontal direction, or a first horizontal direction of the first substrate 100. For example, the second direction Y can be a second length direction, a short side length direction, a vertical direction, or a second vertical direction of the first substrate 100.

The non-display area IA can be an area in which no image is displayed, and can be a peripheral circuit area, a signal supply area, an inactive area, or a bezel area. The non-display area IA can be configured to surround the display area AA. The display panel or the first substrate 100 can further include a peripheral circuit unit 150 disposed in the non-display area IA. The peripheral circuit unit 150 can include a gate driving circuit connected to the plurality of sub-pixels SP.

The second substrate 500 can be configured to overlap the display area AA. The second substrate 500 can be bonded to face the first substrate 100 through an adhesive member (or a transparent adhesive), or can be disposed in a manner in which an organic material or an inorganic material is stacked on the first substrate 100. The second substrate 500 can be an upper substrate or an encapsulation substrate, and can correspond to encapsulating the first substrate 100.

The foldable display apparatus according to an embodiment of the present disclosure can include a folding area FA in which folding is actually performed when folding or bending is performed and a non-folding area NFA provided on one side or another side of the folding area FA and in which a separate folding is not performed.

Figure 2:
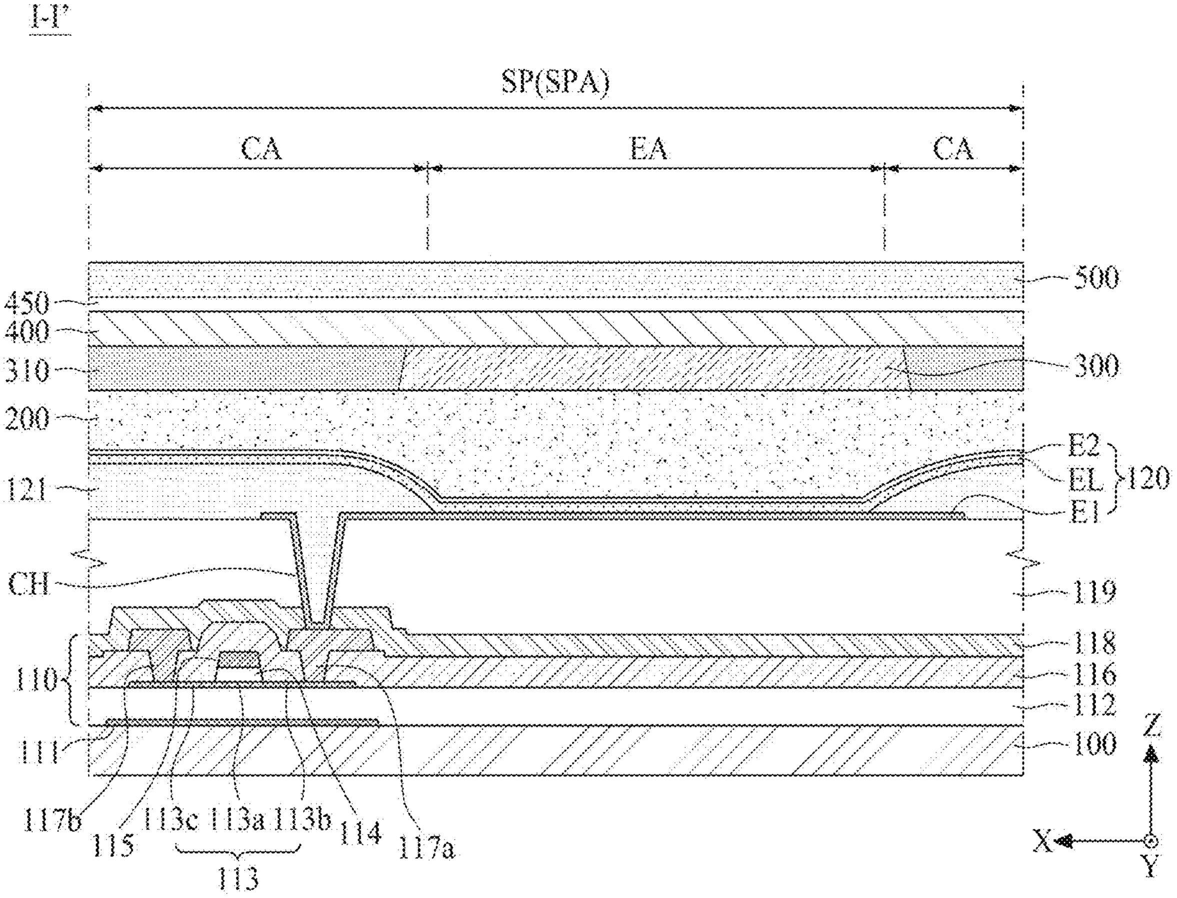
FIG. 2 is a schematic cross-sectional view illustrating a foldable display apparatus according to an embodiment of the present disclosure. In this case, FIG. 2 corresponds to a cross-section taken along line I-I' illustrated in FIG. 1.

FIG. 2 is a schematic cross-sectional view illustrating a foldable display apparatus according to an embodiment of the present disclosure. In this case, FIG. 2 corresponds to a cross-section taken along line I-I' illustrated in FIG. 1.

As shown in FIG. 2, the foldable display apparatus according to an embodiment of the present disclosure can include a first substrate 100, a circuit element layer 110, a light emitting element layer 120, an encapsulation layer 200, a color filter 300, a light guide member 400, and a second substrate 500.

The first substrate 100 can include a thin film transistor, and can be a first substrate, a base substrate, a lower substrate, a transparent glass substrate, a transparent plastic substrate, or a base member.

The first substrate 100 can include a circuit element layer 110, a planarization layer 119, and a light emitting element layer 120. The circuit element layer 110 can include the buffer layer 112, the pixel circuit, and the protective layer 118.

The buffer layer 112 can be disposed on the entire first surface (or front surface) of the first substrate 100. The buffer layer 112 can serve to block diffusion of a material contained in the first substrate 100 into the transistor layer during a high-temperature process during a thin film transistor manufacturing process or can also serve to prevent external moisture or humidity from penetrating toward the light emitting element layer 120. Optionally, the buffer layer 112 can be omitted in some cases.

The pixel circuit can include a driving thin film transistor disposed in the circuit area CA of each subpixel SP. The driving thin film transistor can include an active layer 113, a gate insulating layer 114, a gate electrode 115, an interlayer insulating layer 116, a drain electrode **117*b*, and a source electrode 117*a***.

The active layer 113 can be formed of a semiconductor material based on any one of amorphous silicon, polycrystalline silicon, oxide, and organic material. The active layer 113 can include a channel region **113*a*, a drain region 113*c*, and a source region 113*b***.

The gate insulating layer 114 can be formed in an island shape only on the channel region **113*a* of the active layer 113 or can be formed on the entire front surface of the first substrate 100 or the buffer layer 112 including the active layer 113**.

The gate electrode 115 can be disposed on the gate insulating layer 114 to overlap the channel region **113*a* of the active layer 113**.

The interlayer insulating layer 116 can be formed on the gate electrode 115 and the drain region **113*c* and the source region 113*b* of the active layer 113. The interlayer insulating layer 116 can be formed on the entire front surface of the first substrate 100 or the buffer layer 112. For example, the interlayer insulating layer 116** can be formed of an inorganic material or an organic material.

The drain electrode **117*b* can be disposed on the interlayer insulating layer 116 to be electrically connected to the drain region 113*c* of the active layer 113. The source electrode 117*a* can be disposed on the interlayer insulating layer 116 to be electrically connected to the source region 113*b* of the active layer 113**.

The pixel circuit can further include at least one capacitor and at least one switching thin film transistor disposed in the circuit area CA together with the driving thin film transistor.

The foldable display apparatus according to the present disclosure can further include a light blocking layer 111 provided under at least one active layer 113 of the driving thin film transistor and the switching thin film transistor. The light blocking layer 111 can be configured to minimize or prevent a change in a threshold voltage of the thin film transistor due to external light.

The protective layer 118 can be configured on a pixel circuit. For example, the protective layer 118 can be configured to surround the drain electrode **117*b*, the source electrode 117*a*, and the interlayer insulating layer 116 of a driving thin film transistor. For example, the protective layer 118** can be formed of an inorganic insulating material, and can be expressed in terms of a passivation layer or the like.

The planarization layer 119 can be provided on the circuit element layer 110. The planarization layer 119 can be formed on the entire display area and the rest of the non-display area except for the pad area. For example, the planarization layer 119 can include an extension part (or an expansion part) extending or expanding from the display area toward the non-display area except for the pad area. Thus, the planarization layer 119 can have a size relatively larger than that of the display area.

The planarization layer 119 according to an embodiment can be formed to have a relatively large thickness to provide a planarization surface on the circuit element layer 110. For example, the planarization layer 119 can be made of an organic material such as photoacrylic, benzocyclobutene, polyimide, fluorine resin, etc.

Meanwhile, the planarization layer 119 can include a light extraction unit disposed in each sub-pixel SP. The light extraction unit can be formed in the planarization layer 119 to overlap the light emitting area EA defined in the sub-pixel area SPA of each sub-pixel SP. In this case, the light extraction unit can be formed in the planarization layer 119 to have a curved portion (or a non-flat portion). In this case, the curved portion can include a plurality of concave portions and a convex portion. The light extraction unit can be formed in the planarization layer 119 to have a curved (or uneven) shape. When the light extraction unit is provided in the planarization layer 119, external extraction efficiency of light emitted from the light emitting element layer 120 can increase.

The light emitting element layer 120 can overlap the light emitting area EA of each subpixel SP. The light emitting element layer 120 according to an embodiment can include a first electrode E1, an emission layer, and a second electrode E2. For example, the first electrode E1, the emission layer, and the second electrode E2 can be configured to emit light toward the second substrate 500 according to a top emission method. However, the present disclosure is not limited thereto, and can be configured to emit light toward the first substrate 100 according to a bottom emission method.

The first electrode E1 can be formed on the planarization layer 119 of the sub-pixel area SPA to be electrically connected to the source electrode 117*a* of the driving thin film transistor. One end of the first electrode E1 adjacent to the circuit area CA can be electrically connected to the source electrode 117*a* of the driving thin film transistor through an electrode contact hole CH provided in the planarization layer 119 and the protective layer 118.

The emission layer can be formed on the first electrode E1 to be in direct contact with the first electrode E1.

The emission layer EL according to an embodiment can include two or more organic emission layers for emitting white light. For example, the emission layer EL can include a first organic emission layer and a second organic emission layer for emitting white light by mixing the first light and the second light.

The second electrode E2 can be formed on the emission layer to be in direct contact with the emission layer. The second electrode E2 can be formed (or deposited) on the emission layer to have a relatively thin thickness compared to the emission layer.

The first electrode E1 according to an embodiment of the present disclosure can include a metal material having high reflectivity in order to reflect light emitted from the emission layer and incident thereto toward the second substrate 500. For example, the first electrode E1 can include a single-layered structure or a multilayer structure formed of any one material selected from aluminum (Al), silver (Ag), molybdenum (Mo), gold (Au), magnesium (Mg), calcium (Ca), or barium (Ba). The first electrode E1 can be an anode electrode.

Meanwhile, when the light extraction unit is provided in the planarization layer 119, the first electrode E1, the emission layer, and the second electrode E2 can have a surface shape that directly follows a surface morphology of the light extraction unit including a plurality of convex portions and a plurality of concave portions. For example, the first electrode E1, the emission layer, and the second electrode E2 are formed in a conformal shape that directly follows the surface shape (or morphology) of the light extraction unit by a deposition process of a transparent conductive material, and thus can have a cross-sectional structure having the same shape as the light extraction unit.

The foldable display apparatus according to the exemplary configuration of the present disclosure can further include a bank layer 121. The bank layer 121 can be disposed on the planarization layer 119 and the edge of the first electrode E1. The bank layer 121 can be formed of a transparent material or an opaque material. For example, the bank layer 121 can be a transparent bank layer or a black bank layer. For example, the bank layer 121 can be formed of a photosensitizer including a black pigment, and in this case, the bank layer 121 can also serve as a light blocking member between the adjacent sub-pixels SP.

The encapsulation layer 200 can be formed on the first substrate 100 to surround the light emitting element layer 120. The encapsulation layer 200 can be formed on the second electrode E2. For example, the encapsulation layer 200 can surround a display area. The encapsulation layer 200 can protect the thin film transistor and the emission layer from external impact and can serve to prevent oxygen or/and moisture, further particles from penetrating into the emission layer.

The encapsulation layer 200 according to the present disclosure can include a plurality of inorganic encapsulation layers. In addition, the encapsulation layer 200 can further include at least one organic encapsulation layer interposed between a plurality of inorganic encapsulation layers. The encapsulation layer 200 according to another embodiment can be changed into a filler surrounding the entire display area, and in this case, the second substrate 500 can be bonded to the first substrate 100 through a filler. The filler can include a getter material that absorbs oxygen or/and moisture.

The color filter 300 can be provided on the encapsulation layer 200. Specifically, it can be disposed between the encapsulation layer 200 and the second substrate 500. The color filter 300 can be disposed between the encapsulation layer 200 and the second substrate 500 to overlap at least one light emitting area EA. For example, the color filter 300 can be formed directly on the upper surface of the encapsulation layer 200 to overlap the light emitting area EA. In this case, the color filter 300 can directly contact the upper surface of the encapsulation layer 200. However, the present disclosure is not limited thereto, and the color filter 300 can be disposed on the inner surface of the second substrate 500 facing the upper surface of the encapsulation layer 200 to overlap the light emitting area EA. For example, the second substrate 500 having the color filter 300 can be coupled to the encapsulation layer 200 via a transparent adhesive member.

The color filter 300 can have a size wider than that of the light emitting area EA. For example, the color filter 300 can have a size corresponding to the entire sub-pixel area SPA of each sub-pixel SP, thereby reducing light leakage between adjacent sub-pixels SP.

The color filter 300 according to the present disclosure can be configured to transmit a wavelength of a color set in the sub-pixel SP. For example, when one pixel P is composed of first to fourth sub-pixels, the color filter 300 can include a red color filter provided in the first sub-pixel emitting red light, a green color filter provided in the third sub-pixel emitting green light, and a blue color filter provided in the fourth sub-pixel emitting blue light. The second sub-pixel emitting white light may not include a color filter layer or can include a transparent material for step compensation, thereby emitting white light.

The black matrix 310 can be provided between a plurality of color filters 300.

The black matrix 310 can be disposed to overlap with the remaining regions of each sub-pixel SP except for the emission area EA. Alternatively, the remaining region of each sub-pixel SP except for the emission area EA can include a stacked structure of at least two color filters instead of the black matrix 310. For example, the remaining region of each sub-pixel SP except for the emission area EA can include a stacked structure of at least two of a red color filter, a green color filter, and a blue color filter. The stacked structure of at least two color filters can prevent color mixing between the adjacent sub-pixels SP instead of the black matrix 310.

The second substrate 500 can be provided on the color filter 300. The second substrate 500 can be made of a plastic material, a glass material, or a metal material. Meanwhile, when the encapsulation layer 200 includes a plurality of inorganic encapsulation layers, the second substrate 500 can be omitted.

Optionally, when the encapsulation layer 200 is changed to a filler, the second substrate 500 can be combined with a filler, and in this case, the second substrate 500 can be made of a plastic material, a glass material, or a metal material.

The light guide member 400 can be provided between the color filter 300 and the second substrate 500. The light guide member 400 can be disposed or configured on a first surface of the second substrate 500, for example, a lower surface opposite to the upper surface (or light emitting surface).

The light guide member 400 according to an embodiment of the present disclosure can be coupled to the lower surface of the second substrate 500 via an adhesive member (or a first transparent adhesive member) 450. For example, the light guide member 400 can be coupled to the entire lower surface of the second substrate 500 via the adhesive member 450. In this case, the light guide member 400 can have the same size as the lower surface of the second substrate 500.

The light guide member 400 can be configured to improve black visibility characteristics due to reflection of external light in a non-driving or off state of the foldable display apparatus. For example, in a non-driving or off state of the foldable display apparatus, light incident from the outside is reflected by electrodes and wirings of the circuit element layer 110 to form reflected light, and the reflected light can form a rainbow mura (or rainbow stain pattern) that has a rainbow color and spreads radially and/or a circular ring pattern in a radial form due to the dispersion characteristics of light according to diffraction characteristics.

The reflected light can cause multiple interferences and/or reinforcement interferences of light according to the difference in refractive angles for each wavelength to generate a rainbow mura and/or a circular ring pattern in the form of radiation, thereby reducing black visibility characteristics.

The light guide member 400 according to an embodiment of the present disclosure can be configured to diffract and/or scatter external light incident into the display device through the second substrate 500 from the outside based on the light refracting principle according to the cross-sectional shape having the refractive index difference, or to redisperse (or disperse) the diffraction dispersion spectrum of the reflected light. For example, the light guide member 400 can suppress or minimize the occurrence of the radial rainbow mura phenomenon through mixing between adjacent spectra according to the diffraction order of the reflected light by reducing the intensity of the diffraction dispersion spectrum or redispersing the diffraction dispersion spectrum to greatly expand the size of the spectrum.

The light guide member 400 can include a lens pattern. The lens pattern can diffract and/or scatter external light incident on the light emitting element layer 120 from the outside based on the light refraction principle having a difference in refractive index, or diffract and/or scatter the reflected light. Accordingly, the occurrence of a rainbow mura and/or a circular ring pattern can be reduced or minimized by canceling or minimizing multiple interferences and/or reinforcing interferences of the reflected light, and according to an embodiment of the present disclosure, a decrease in black vision characteristics caused by reflection of external light can be reduced, and real black can be realized in a non-driving or off state. For example, the light guide member 400 can be a light guide pattern unit, a light refracting unit, a light refracting member, a spectrum dispersion unit, a spectrum reduction unit, or a diffraction spectrum dispersion unit.

Meanwhile, the foldable display apparatus according to an embodiment of the present disclosure can further include a polarizing member. The polarizing member can be provided on the light guide member 400 to block light introduced from the outside from being reflected by a pixel circuit or the like.

By including the light guide member 400, the foldable display apparatus according to an embodiment of the present disclosure can improve black visibility characteristics due to reflection of external light, occurrence of Rainbow Mura and Ring Mura phenomena can be minimized or reduced, thereby realizing real black in a non-driving or off state.

Figure 3:
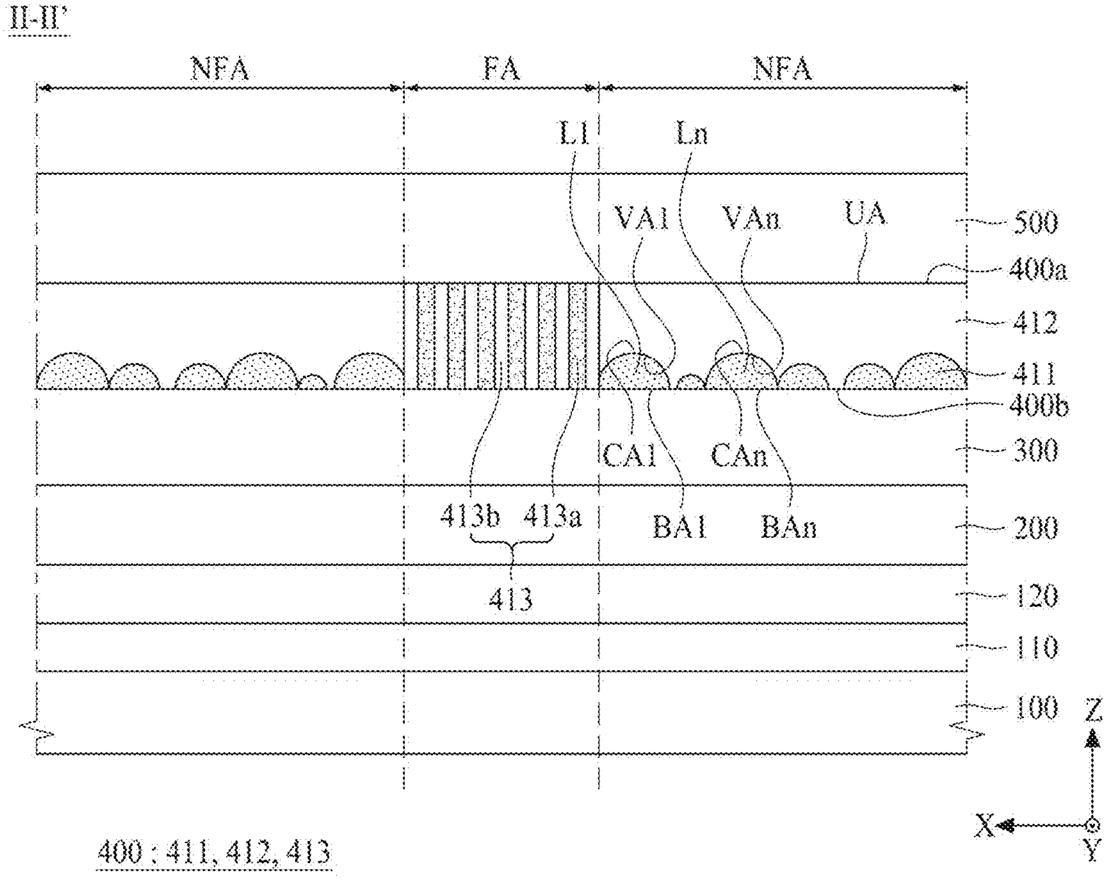
FIG. 3 is a schematic cross-sectional view illustrating a foldable display apparatus according to an embodiment of the present disclosure. In this case, FIG. 3 corresponds to a cross-section taken along line II-II' illustrated in FIG. 1.

FIG. 3 is a schematic cross-sectional view illustrating a foldable display apparatus according to an embodiment of the present disclosure. Meanwhile, configurations of the first substrate 100, the circuit element layer 110, the light emitting element layer 120, the encapsulation layer 200, the color filter 300, and the second substrate 500 are the same as those of FIG. 2 described above, and thus repeated descriptions thereof will be omitted or may be briefly mentioned.

As shown in FIG. 3, the foldable display apparatus according to an embodiment of the present disclosure can include a first substrate 100, a circuit element layer 110, a light emitting element layer 120, an encapsulation layer 200, a color filter 300, a light guide member 400, and a second substrate 500.

According to an embodiment of the present disclosure, the light guide member 400 can include a refractive layer 411, a filling layer 412, and an intermediate layer 413.

The light guide member 400 can include various polymer materials such as a polyacrylate-based polymer, a polymethamethylacrylate-based polymer, a polyurethane-based polymer, a polyvinyl alcohol-based polymer, a polyvinyl chloride-based polymer, and a polyamide-based polymer. However, the material of the light guide member 400 is not limited to the polymer exemplified above, but can include various materials according to the level of the art.

The refractive layer 411 can be provided in the non-folding area NEA.

The refractive layer 411 can include a plurality of lens patterns L1 to Ln, where n is a natural number such as an integer greater than 1. In this case, each of the plurality of lens patterns L1 to Ln can include lower surfaces BA1 to Ban corresponding to a portion of the lower surface 400*b* of the light guide member 400, and convex surfaces VA1 to Van that are convexly formed from the lower surfaces BA1 to Ban. For example, among the plurality of lens patterns L1 to Ln, the first lens pattern L1 can include a first lower surface BA1 and a first convex surface VA1 that is convexly formed from the first lower surface BA1.

According to an embodiment of the present disclosure, the first lens pattern L1 can include the first lower surface BA1 and the first convex surface VA1, and thus can be provided in a hemispherical shape. Likewise, the plurality of lens patterns L1 to Ln can include the lower surfaces BA1 to Ban and the convex surfaces VA1 to Van, which are formed convexly from the lower surfaces BA1 to Ban, and thus can be provided in a hemispherical shape. Meanwhile, the shape of the plurality of lens patterns L1 to Ln is not limited to a hemispherical shape, and can be formed so that two or more of the plurality of lens patterns L1 to Ln overlap, and the shape of the plurality of lens patterns L1 to Ln can be provided in a polygonal shape, and various shapes can be selected according to the level of the art.

The refractive layer 411 can be formed in an atypical shape and can be arranged in an irregular arrangement. The refractive layer 411 can prevent an occurrence of a mura, for example, a rainbow mura or a ring mura, by reflecting external light introduced from the outside of the foldable display apparatus according to an embodiment of the present disclosure by a plurality of electrodes, wirings, and circuits provided in the display device. Specifically, the refractive layer 411 can be irregularly arranged in an atypical shape, thereby preventing or minimizing the occurrence of a mura perceived by a certain regularity. Meanwhile, a state in which the plurality of lens patterns L1 to Ln provided in the refractive layer 411 are irregularly arranged in an atypical shape will be described in more detail with reference to FIG. 11.

The filling layer 412 can be provided in the non-folding area NFA.

The filling layer 412 can be provided on the refractive layer 411 or can be provided between the refractive layers 411. The filling layer 412 can include an upper surface UA corresponding to the upper surface 400*a* of the light guide member 400, and a plurality of concave surfaces CA1 to Can concavely formed from the upper surface UA.

The plurality of concave surfaces CA1 to Can of the filling layer 412 can correspond to a plurality of convex surfaces VA1 to Van of the refractive layer 411. More specifically, a first concave surface CA1 of the plurality of concave surfaces CA1 to Can of the filling layer 412 can correspond to a first convex surface VA1 of the refractive layer 411. Likewise, the plurality of concave surfaces CA1 to Can can correspond to the plurality of convex surfaces VA1 to Van.

A partial region of the filling layer 412 can be provided between the refractive layers 411 and can be provided between a plurality of lens patterns L1 to Ln of the refractive layer 411. In this case, a partial region of the filling layer 412 may not have the concave surfaces CA1 to Can, and further, a partial region of the filling layer 412 may not correspond to the convex surfaces VA1 to Van of the refractive layer 411. In this case, a partial region of the filling layer 412 can be in contact with the lower surface 400*b* of the light guide member 400.

According to an embodiment of the present disclosure, the refractive index of the filling layer 412 and the refractive index of the refractive layer 411 can have a predetermined difference. In detail, the refractive layer 411 can have a first refractive index, and the filling layer 412 can have a second refractive index different from the first refractive index. For example, the difference between the second refractive index of the filling layer 412 and the first refractive index of the refractive layer 411 can be 0.07. However, the difference between the second refractive index and the first refractive index is not limited thereto.

By forming in this way, Ring Mura or Rainbow Mura generated when light introduced from the outside of the light guide member 400 is reflected from electrodes and wiring inside the foldable display apparatus according to an embodiment of the present disclosure can be prevented or minimized.

The intermediate layer 413 can be provided in the folding area FA, and can be provided between the refractive layer 411 and the filling layer 412 provided in the non-folding area NFA.

The intermediate layer 413 can be continuously provided in the folding area FA from the lower surface 400*b* of the light guide member 400 to the upper surface 400*a* of the light guide member 400. By forming in this way, even when the folding area FA is folded, a lifting phenomenon or a peeling phenomenon of the light guide member 400 due to folding can be removed, prevented or minimized.

According to an embodiment of the present disclosure, the intermediate layer 413 can extend in the second direction Y and can include a plurality of first portions 413*a* and a plurality of second portions 413*b* alternately formed along the first direction X.

Each of the first portion 413*a* and the second portion 413*b* can be continuously provided from the lower surface 400*b* of the light guide member 400 to the upper surface 400*a* of the light guide member 400 as described above.

According to an embodiment of the present disclosure, the modulus of the first portion 413*a* can be smaller than that of the second portion 413*b*. Since the first portion 413*a* having a relatively small modulus and the second portion 413*b* having a relatively large modulus are formed to cross each other along the first direction X, even when the folding area FA is folded, a lifting phenomenon or a peeling phenomenon of the light guide member 400 due to folding can be removed, prevented or minimized.

Furthermore, since the first portion 413*a* having a relatively small modulus and the second portion 413*b* having a relatively large modulus are formed to cross along the first direction X, the light guide member 400 provided in the folding area FA, for example, the intermediate layer 413 can remain flat without generating curl (or sagging or bending).

According to an embodiment of the present disclosure, the first portion 413*a* can include the same material as the refractive layer 411, and the second portion 413*b* can include the same material as the filling layer 412. Accordingly, the modulus of the first portion 413*a* can be the same as that of the refractive layer 411, and the modulus of the second portion 413*b* and the modulus of the filling layer 412 can be the same. However, the material of the first portion 413*a* and the second portion 413*b* is not limited thereto, and the first portion 413*a* can include a material different from that of the refractive layer 411, and the second portion 413*b* can include a material different from that of the filling layer 412.

Figure 4:
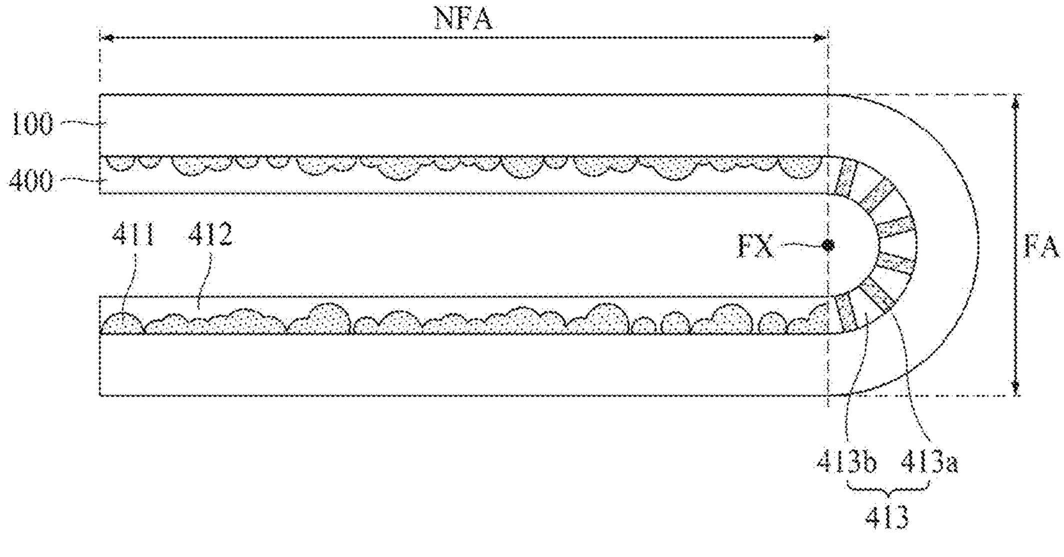
FIG. 4 is a schematic cross-sectional view illustrating a foldable display apparatus according to another embodiment of the present disclosure.

FIG. 4 is a schematic cross-sectional view illustrating a foldable display apparatus according to another embodiment of the present disclosure, and FIG. 4 is a view illustrating a state in which the folding area of FIG. 3 is folded.

As shown in FIG. 4, when the foldable display apparatus according to an embodiment of the present disclosure is folded, the non-folding area NFA is not separately folded, and the folding area FA can be folded along the folding axis FX.

When the folding area FA is folded, a relatively large force can be applied to the folding area FA compared to the non-folding area NFA. According to the present disclosure, since the light guide member 400 includes the intermediate layer 413 in an area corresponding to the folding area FA, even when the folding area FA is folded, a phenomenon in which the light guide member 400 is lifted or peeled off can be removed, prevented or minimized.

Specifically, the intermediate layer 413 can include a continuous area in which the plurality of first portions 413*a* and the second portion 413*b* have the same modulus from the upper surface 400*a* of the light guide member 400 to the lower surface 400*b* of the light guide member 400 in the folding area FA, and the plurality of first portions 413*a* and the plurality of second portions 413*b* are alternately provided, so that even if the folding area FA is folded, a phenomenon in which the light guide member 400 is lifted or peeled off can be removed, prevented or minimized.

Meanwhile, FIG. 4 shows a form in which the upper surface 400*a* of the light guide member is folded to be located inside, but the present disclosure is not limited thereto, and the upper surface 400*a* of the light guide member can be folded to be located outside.

Figure 5:
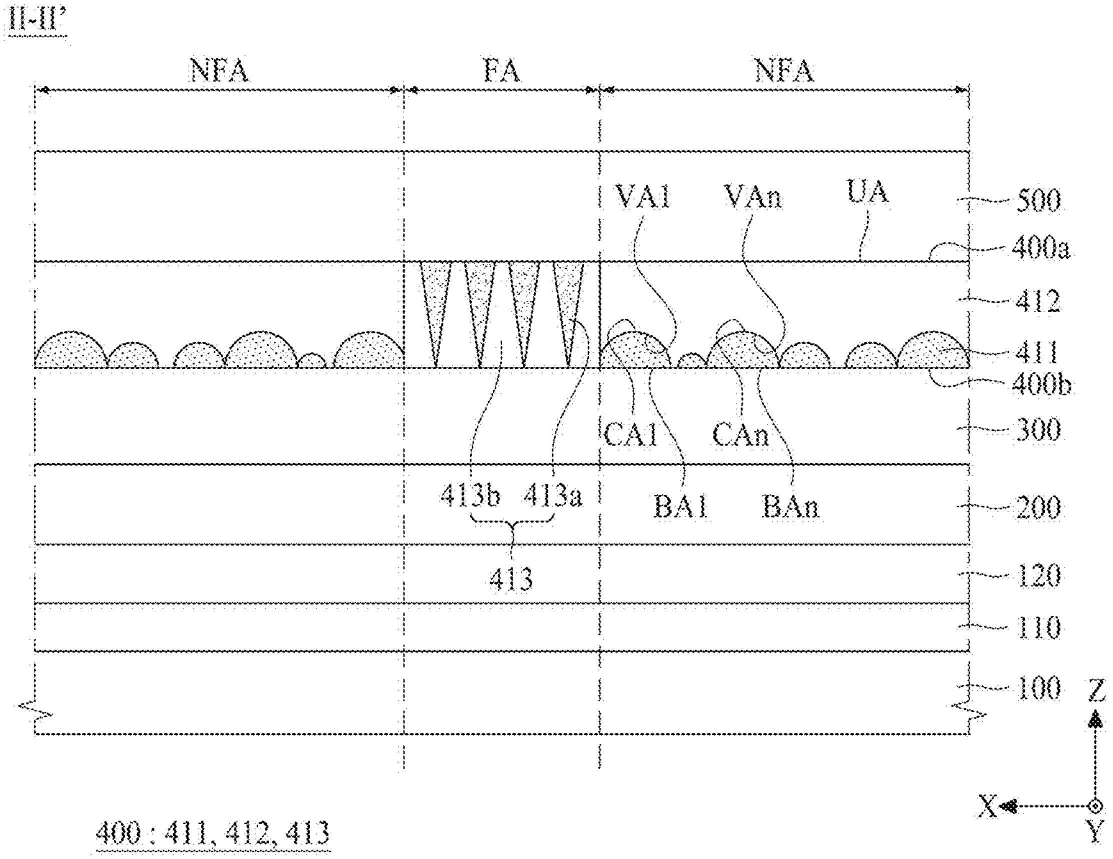
FIG. 5 is a schematic cross-sectional view illustrating a foldable display apparatus according to another embodiment of the present disclosure. In this case, FIG. 5 corresponds to the cross-section of taken along line II-II' illustrated in FIG. 1.

FIG. 5 is a schematic cross-sectional view illustrating a foldable display apparatus according to another embodiment of the present disclosure. Meanwhile, the embodiment of FIG. 5 is the same as an embodiment of FIG. 3 except for the configurations of a first portion and a second portion of an intermediate layer provided in a folding area, and thus different configurations will be mainly described below.

As shown in FIG. 5, according to another embodiment of the present disclosure, the intermediate layer 413 of the light guide member 400 can be provided in the folding area FA. In this case, the first portion 413*a* of the intermediate layer 413 can be provided in the shape of an inverted triangle. Specifically, the cross section of the first portion 413*a* of the intermediate layer 413 can be provided in the shape of an inverted triangle. Accordingly, the first portion 413*a* can have a relatively large area on the upper surface 400*a* of the light guide member 400, and can have a relatively narrow area on the lower surface 400*b* of the light guide member 400.

The second portion 413*b* of the intermediate layer 413 can be provided in a shape corresponding to the first portion 413*a*. Accordingly, the second portion 413*b* can have a relatively narrow area on the upper surface 400*a* of the light guide member 400, and can have a relatively large area on the lower surface 400*b* of the light guide member 400.

According to an embodiment of the present disclosure, in the folding area FA, the intermediate layer 413 can be continuously provided from the upper surface 400*a* of the light guide member 400 to the lower surface 400*b* of the light guide member 400, and the plurality of first portions 413*a* and the plurality of second portions 413*b* are intersected, so that even if folding or bending occurs in the folding area FA, it is possible to minimize or prevent the occurrence of a lifting phenomenon or peeling phenomenon in the light guide member 400 due to the stress applied to the folding area FA.

Figure 6:
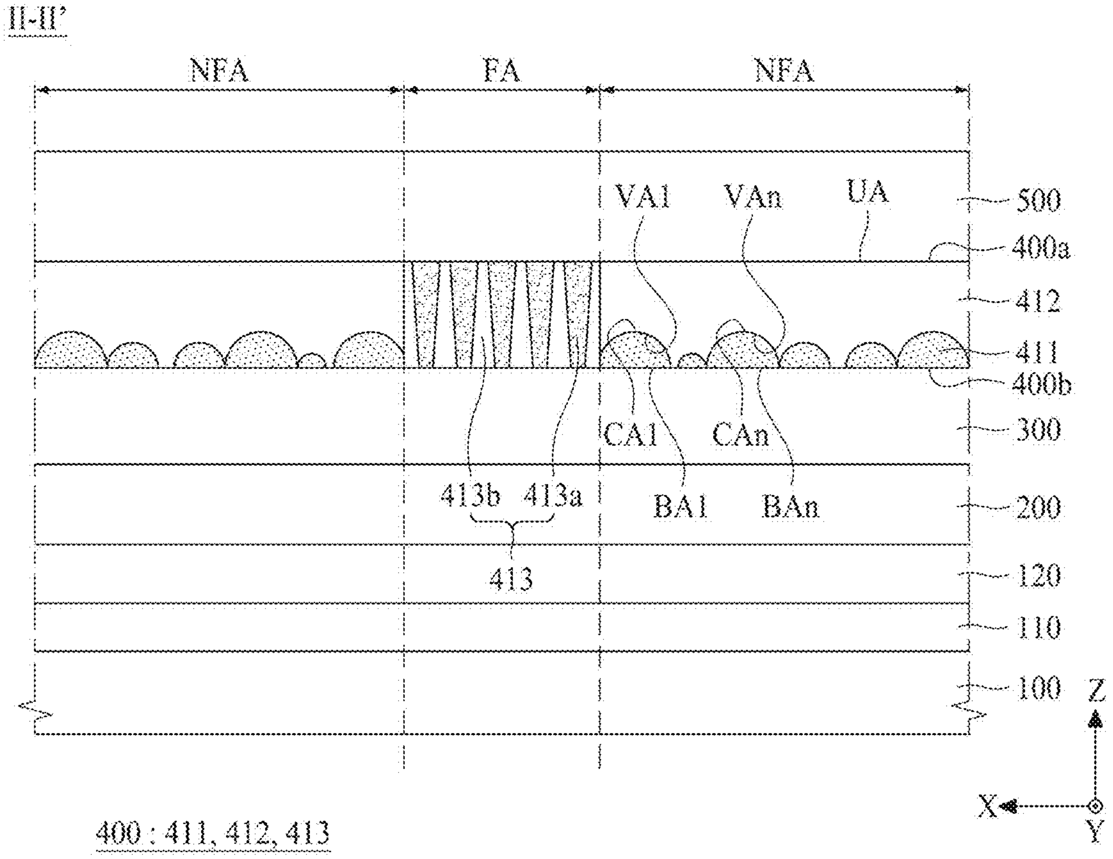
FIG. 6 is a schematic cross-sectional view illustrating a foldable display apparatus according to another embodiment of the present disclosure. In this case, FIG. 6 corresponds to the cross-section of taken along line II-II' illustrated in FIG. 1.

FIG. 6 is a schematic cross-sectional view illustrating a foldable display apparatus according to another embodiment of the present disclosure. Meanwhile, the embodiment according to FIG. 6 is the same as an embodiment according to FIG. 3 except for the configurations of a first portion and a second portion of an intermediate layer provided in a folding area, and thus different configurations will be mainly described below.

As shown in FIG. 6, according to another embodiment of the present disclosure, the intermediate layer 413 of the light guide member 400 can be provided in the folding area FA. In this case, the first portion 413*a* of the intermediate layer 413 can be provided in the shape of an inverted trapezoid. Specifically, the cross section of the first portion 413*a* of the intermediate layer 413 can be provided in the shape of an inverted trapezoid. Accordingly, the first portion 413*a* can have a relatively large area on the upper surface 400*a* of the light guide member 400, and can have a relatively narrow area on the lower surface 400*b* of the light guide member 400.

The second portion 413*b* of the intermediate layer 413 can be provided in a shape corresponding to the first portion 413*a*. Accordingly, the second portion 413*b* can have a relatively narrow area on the upper surface 400*a* of the light guide member 400, and can have a relatively large area on the lower surface 400*b* of the light guide member 400.

According to an embodiment of the present disclosure, in the folding area FA, the intermediate layer 413 can be continuously provided from the upper surface 400*a* of the light guide member 400 to the lower surface 400*b* of the light guide member 400, and the plurality of first portions 413*a* and the plurality of second portions 413*b* are intersected, so that even if folding or bending occurs in the folding area FA, it is possible to minimize or prevent the occurrence of a lifting phenomenon or peeling phenomenon in the light guide member 400 due to the stress applied to the folding area FA.

Figure 7:
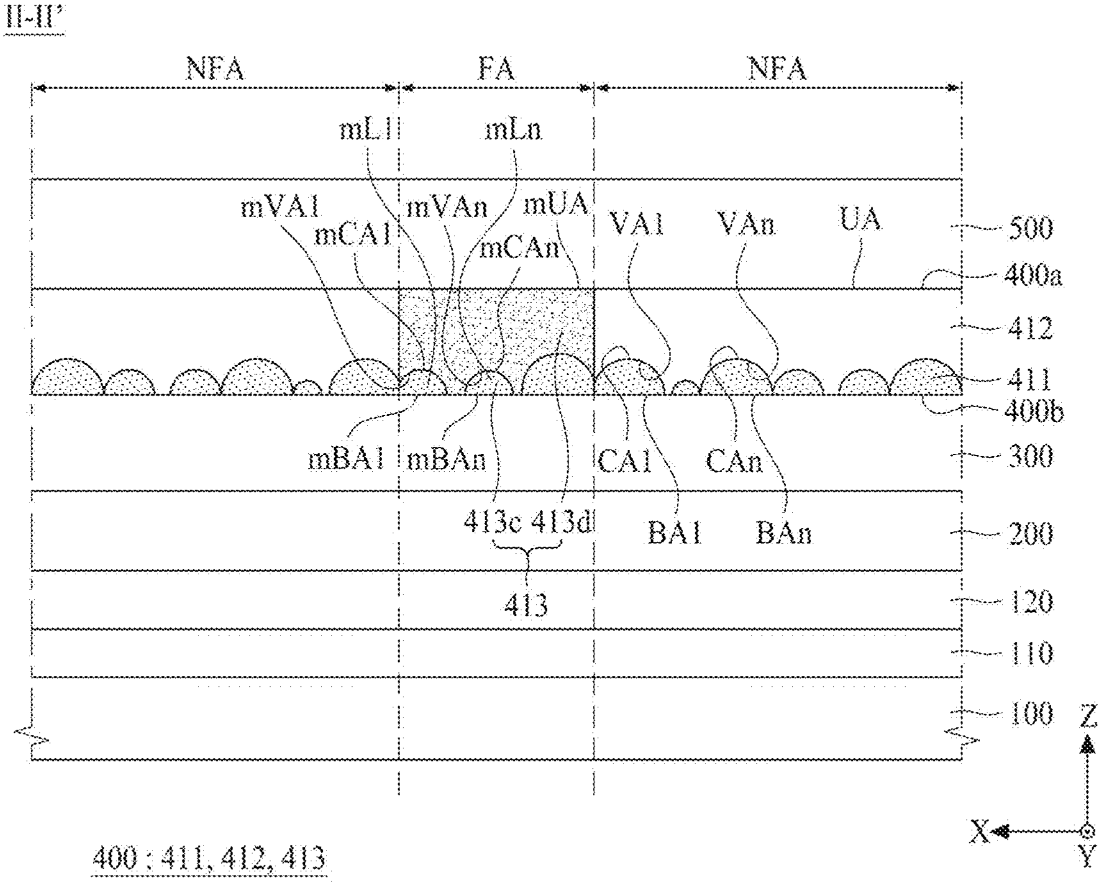
FIG. 7 is a schematic cross-sectional view illustrating a foldable display apparatus according to another embodiment of the present disclosure. In this case, FIG. 7 corresponds to the cross-section of taken along line II-II' illustrated in FIG. 1.

FIG. 7 is a schematic cross-sectional view illustrating a foldable display apparatus according to another embodiment of the present disclosure. Meanwhile, the embodiment according to FIG. 7 is the same as an embodiment according to FIG. 3 except for the configuration of the light guide member, and thus different configurations will be mainly described below.

As shown in FIG. 7, the intermediate layer 413 can be provided in the folding area FA, and can include a third portion 413*c* and a fourth portion 413*d*.

The third portion 413*c* can include a plurality of lens patterns mL1 to mLn. In this case, each of the plurality of lens patterns mL1 to mLn can include lower surfaces mBA1 to mBAn corresponding to a portion of the lower surface 400*b* of the light guide member 400, and convex surfaces mVA1 to mVAn that are convexly formed from the lower surfaces mBA1 to mBAn. For example, among the plurality of lens patterns mL1 to mLn, the first lens pattern mL1 can include a first lower surface mBA1 and a first convex surface mVA1 that is convexly formed from the first lower surface mBA1.

According to an embodiment of the present disclosure, the first lens pattern mL1 can include the first lower surface mBA1 and the first convex surface mVA1, and thus can be provided in a hemispherical shape. Likewise, the plurality of lens patterns mL1 to mLn can include the lower surface mBA1 to mBAn and the convex surfaces mVA1 to mVAn convexly formed from the lower surface mBA1 to mBAn, and thus can be provided in a hemispherical shape. Meanwhile, the shape of the plurality of lens patterns mL1 to mLn is not limited to the hemispherical shape, and can be formed so that two or more of the plurality of lens patterns mL1 to mLn overlap, the shape of the plurality of lens patterns mL1 to mLn can be provided in a polygonal shape, and various shapes can be selected according to the level of the art.

The third portion 413*c* of the intermediate layer 413 can be formed in an atypical shape and can be arranged in an irregular arrangement. The third portion 413*c* can prevent an occurrence of a mura, for example, a rainbow mura or a ring mura, by reflecting external light introduced from the outside of the foldable display apparatus according to an embodiment of the present disclosure by a plurality of electrodes, wirings, and circuits provided in the display device. Specifically, since the third portion 413*c* is irregularly arranged in an atypical shape, the occurrence of a mura recognized by a certain regularity can be prevented or minimized. Meanwhile, a state in which the plurality of lens patterns mL1 to mLn provided in the third portion 413*c* are irregularly arranged in an atypical shape will be described in more detail with reference to FIG. 11.

The fourth portion 413*d* of the intermediate layer 413 can be provided in the non-folding area NFA.

The fourth portion 413*d* can be disposed on the third portion 413*c* or can be disposed between the third portions 413*c*. The fourth portion 413*d* can include a top surface mUA corresponding to the top surface 400*a* of the light guide member 400, and a plurality of concave surfaces mCA1 to mCAn formed to be concave from the top surface mUA.

The plurality of concave surfaces mCA1 to mCAn of the fourth portion 413*d* can correspond to the plurality of convex surfaces mVA1 to mVAn of the third portion 413*c*. Specifically, the first concave surface mCA1 of a plurality of concave surfaces mCA1 to mCAn of the fourth portion 413*d* can correspond to the first convex surface mVA1 of the third portion 413*c*. Likewise, the plurality of concave surfaces mCA1 to mCAn can correspond to the plurality of convex surfaces mVA1 to mVAn.

A partial region of the fourth portion 413*d* can be provided between the third portion 413*c* and can be provided between a plurality of lens patterns mL1 to mLn of the third portion 413*c*. In this case, a partial region of the fourth portion 413*d* may not have the concave surfaces mCA1 to mCAn and further, a partial region of the fourth portion 413*d* may not correspond to the convex surfaces mVA1 to mVAn of the third portion 413*c*. In this case, a partial region of the fourth portion 413*d* can be in contact with the lower surface 400*b* of the light guide member 400.

According to an embodiment of the present disclosure, the refractive index of the fourth portion 413*d* and the refractive index of the third portion 413*c* can have a predetermined difference. Specifically, the third portion 413*c* can have a third refractive index, and the fourth portion 413*d* can have a fourth refractive index different from the third refractive index. For example, the difference between the fourth refractive index of the fourth portion 413*d* and the third refractive index of the third portion 413*c* can be 0.07. However, the difference between the third refractive index and the fourth refractive index is not limited thereto.

By forming in this way, Ring Mura or Rainbow Mura generated when light introduced from the outside of the light guide member 400 is reflected from electrodes and wiring inside the foldable display apparatus according to an embodiment of the present disclosure can be prevented or minimized.

According to an embodiment of the present disclosure, a difference between the modulus of the third portion 413*c* and the modulus of the fourth portion 413*d* can be relatively smaller than a difference between the modulus of the refractive layer 411 and the modulus of the filling layer 412. For example, the third portion 413*c* and the fourth portion 413*d* can include a material having the same modulus. Accordingly, the intermediate layer 413 including the third portion 413*c* and the fourth portion 413*d* can include a continuous region having the same modulus from the lower surface 400*b* of the light guide member 400 to the upper surface 400*a* of the light guide member 400.

By forming in this way, even if folding or bending occurs in the folding area FA, it is possible to minimize or prevent the occurrence of a lifting phenomenon or peeling phenomenon in the light guide member 400 due to the stress applied to the folding area FA.

Figure 8:
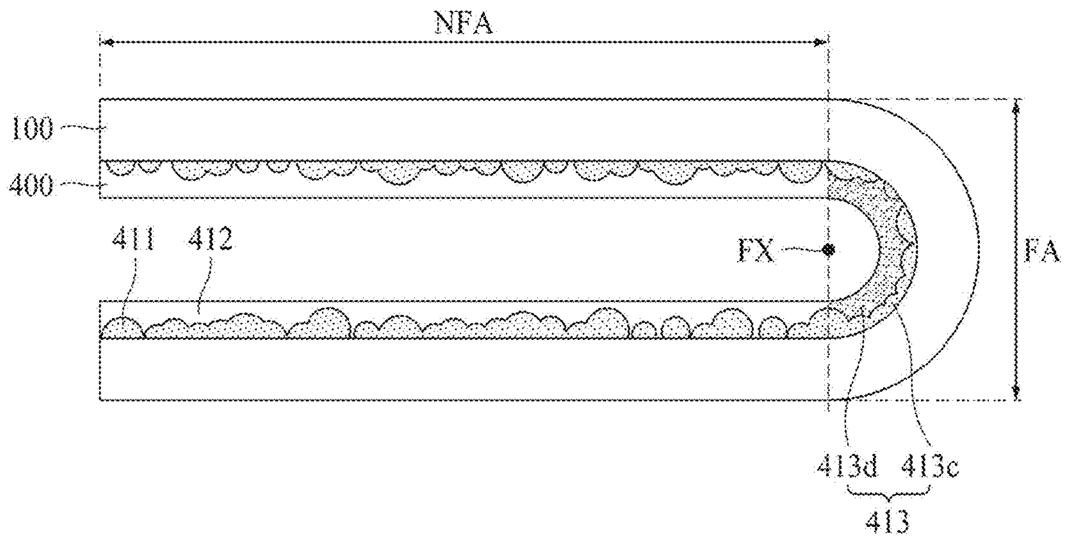
FIG. 8 is a schematic cross-sectional view illustrating a foldable display apparatus according to another embodiment of the present disclosure.

FIG. 8 is a schematic cross-sectional view illustrating a foldable display apparatus according to another embodiment of the present disclosure, and FIG. 8 is a view illustrating a state in which the folding area of FIG. 7 is folded.

As shown in FIG. 8, when the foldable display apparatus according to an embodiment of the present disclosure is folded, the non-folding area NFA is not separately folded, and the folding area FA can be folded along the folding axis FX.

When the folding area FA is folded, a relatively large force can be applied to the folding area FA compared to the non-folding area NFA. According to the present disclosure, since the light guide member 400 includes the intermediate layer 413 in an area corresponding to the folding area FA, even when the folding area FA is folded, a phenomenon in which the light guide member 400 is lifted or peeled off can be removed, prevented or minimized.

Specifically, since the intermediate layer 413 includes a continuous area having the same modulus from the upper surface 400*a* of the light guide member 400 to the lower surface 400*b* of the light guide member 400 in the folding area FA, even if the folding area FA is folded, a phenomenon in which the light guide member 400 is lifted or peeled off can be removed, prevented or minimized.

Meanwhile, FIG. 8 shows a form in which the upper surface 400*a* of the light guide member is folded to be located inside, but the present disclosure is not limited thereto, and the upper surface 400*a* of the light guide member can be folded to be located outside.

Figure 9:
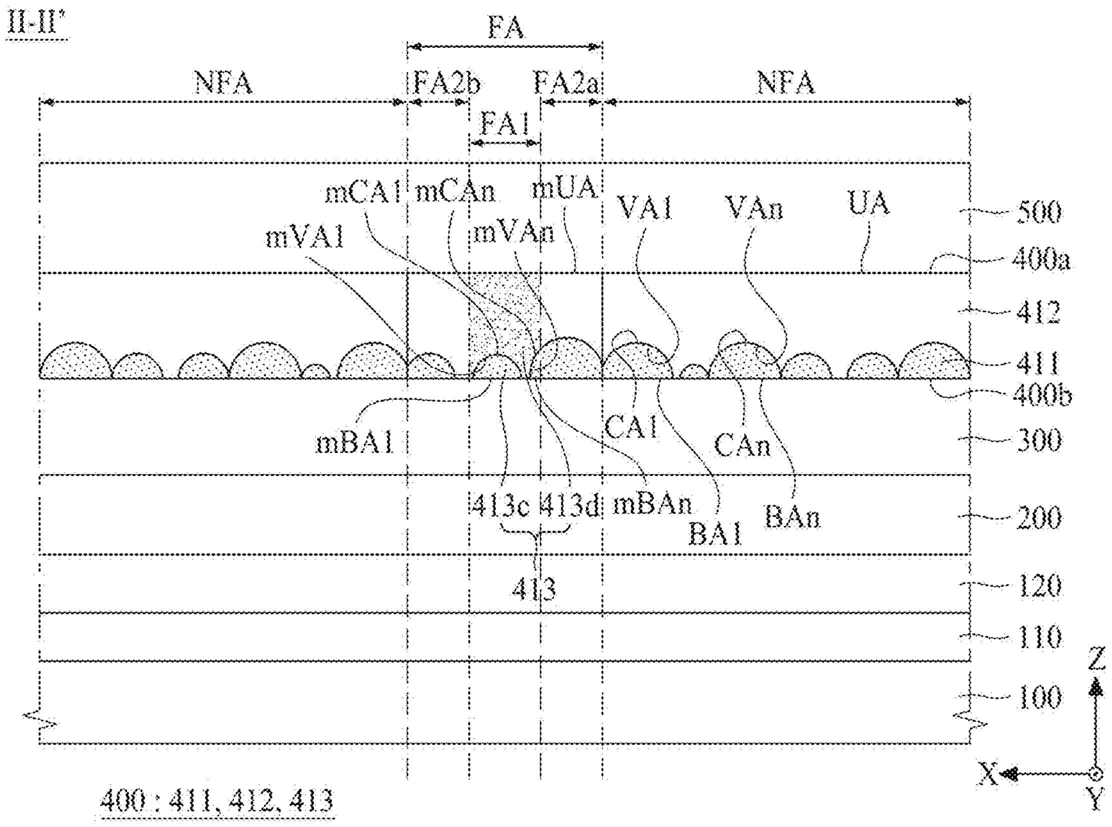
FIG. 9 is a schematic cross-sectional view illustrating a foldable display apparatus according to another embodiment of the present disclosure. In this case, FIG. 9 corresponds to the cross-section of taken along line II-II' illustrated in FIG. 1.

FIG. 9 is a schematic cross-sectional view illustrating a foldable display apparatus according to another embodiment of the present disclosure. Meanwhile, the embodiment according to FIG. 9 is the same as the embodiment according to FIG. 7 except for the configuration of an intermediate layer, and thus different configurations will be mainly described below.

As shown in FIG. 9, the folding area FA can include a first folding area FA1, a second folding area FA2*a*, and a third folding area FA2*b*.

The first folding area FA1 can be provided at the center of the folding area FA. Specifically, the first folding area FA1 can overlap the folding axis FX. In this case, the folding axis FX can be defined as an axis that is a center of folding when the foldable display apparatus according to an embodiment of the present disclosure is folded. Accordingly, the folding area FA can be folded around the folding axis FX.

The first folding area FA1 can include a portion that receives the relatively greatest stress in the folding area FA when the folding area FA is folded. In this case, for example, the portion that receives the relatively greatest stress during folding can be the center of the folding area FA or the first folding area FA1.

The second folding area FA2*a* and the third folding area FA2*b* can be provided on one side of the first folding area FA1, for example, on the right side and another side of the first folding area FA1, for example, on the left side thereof. In this case, the second folding area FA2*a* and the third folding area FA2*b* can receive relatively less stress than the first folding area FA1 when the foldable display apparatus is folded. In other words, the second folding area FA2*a* and the third folding area FA2*b* may not include a portion subjected to relatively the greatest stress when being folded.

According to another embodiment of the present disclosure, unlike in FIG. 7, the intermediate layer 413 can be provided only in a partial area of the folding area FA, for example, in the first folding area FA1. Accordingly, the third portion 413*c* and the fourth portion 413*d* of the intermediate layer 413 can be provided in the first folding area FA1, and may not be provided in the second folding area FA2*a* and the third folding area FA2*b*. Meanwhile, since the third portion 413*c* and the fourth portion 413*d* are the same as those in FIG. 7, repeated descriptions thereof will be omitted.

The refractive layer 411 and the filling layer 412 according to an embodiment of FIG. 3 can be provided in the second and third folding areas FA2*a* and FA2*b*, respectively. Accordingly, the refractive layer 411 including the plurality of lens patterns L1 to Ln and the filling layer 412 provided on the refractive layer 411 and corresponding to the plurality of lens patterns L1 to Ln of the refractive layer 411 can be provided in the second and third folding areas FA2*a* and FA2*b*, respectively. Accordingly, the plurality of lens patterns L1 to Ln of the refractive layer 411 can be continuous from the non-folding area NFA to the second folding area FA2*a* (or the third folding area FA2*b*), and the filling layer 412 can be continuous from the non-folding area NFA to the second folding area FA2*a* (or the third folding area FA2*b*).

Meanwhile, since the refractive layer 411 and the filling layer 412 are the same as those in FIG. 3, repeated descriptions thereof will be omitted.

According to another embodiment of the present disclosure, the modulus of the filling layer 412 provided in the second folding area FA2*a* and the third folding area FA2*b* can be relatively greater than that of the fourth portion 413*d* of the intermediate layer 413 provided in the first folding area FA1. Accordingly, since the ratio of the filling layer 412 having a relatively large modulus increases, the overall strength of the light guide member 400 can increase.

Meanwhile, in the embodiments according to FIGS. 3, 5 and 6 described above, an intermediate layer can be provided only in the first folding area as in the embodiment according to FIG. 9.

Figure 10:
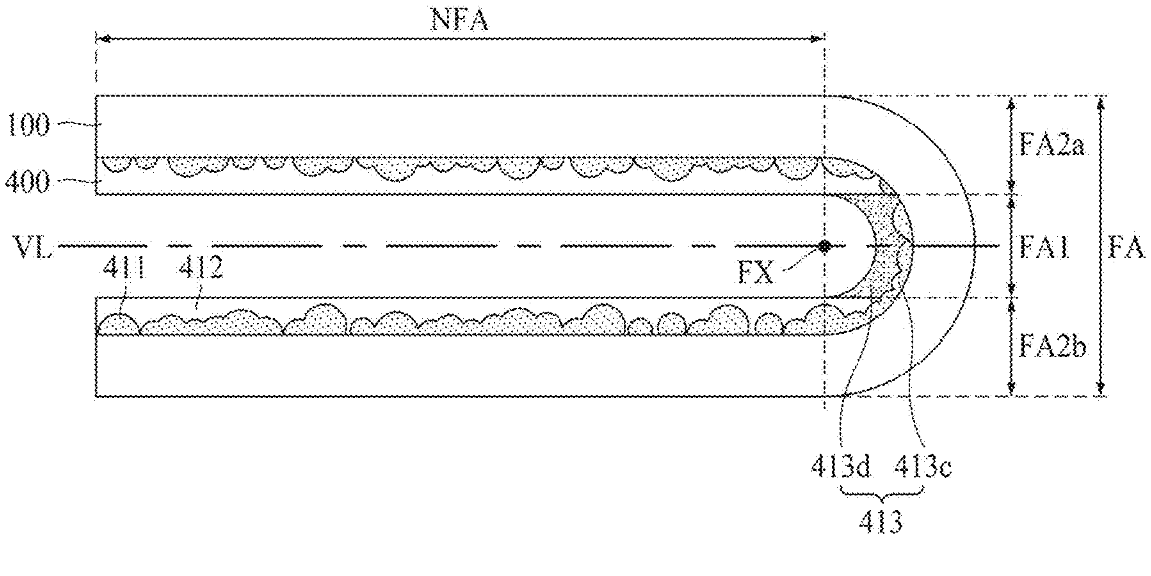
FIG. 10 is a schematic cross-sectional view illustrating a foldable display apparatus according to another embodiment of the present disclosure.

FIG. 10 is a schematic cross-sectional view illustrating a foldable display apparatus according to another embodiment of the present disclosure, and FIG. 10 is a view illustrating a state in which the folding area of FIG. 9 is folded.

Meanwhile, since the embodiment according to FIG. 10 is the same as the embodiment according to FIG. 8 except that the folding area includes the first to third folding areas, different configurations will be mainly described below.

As shown in FIG. 10, the folding area FA can include a first folding area FA1, a second folding area FA2*a*, and a third folding area FA2*b*.

In this case, the first folding area FA1 can overlap the folding axis FX that is the central axis of folding when the folding area FA is folded. In this case, when the folding area FA is folded, a portion of the virtual straight line VL passing through the folding axis FX and extending in the first direction X can receive the relatively greatest stress. Accordingly, since the virtual straight line VL passing through the folding axis FX and extending in the first direction X meets the center of the first folding area FA1, the first folding area FA1 can include a portion under relatively the greatest stress when the folding area FA is folded.

For example, a relatively greater stress can be applied to the light guide member 400 provided in the first folding area FA1 than the light guide member 400 provided in the second folding area FA2*a* and the third folding area FA2*b*.

Figure 11:
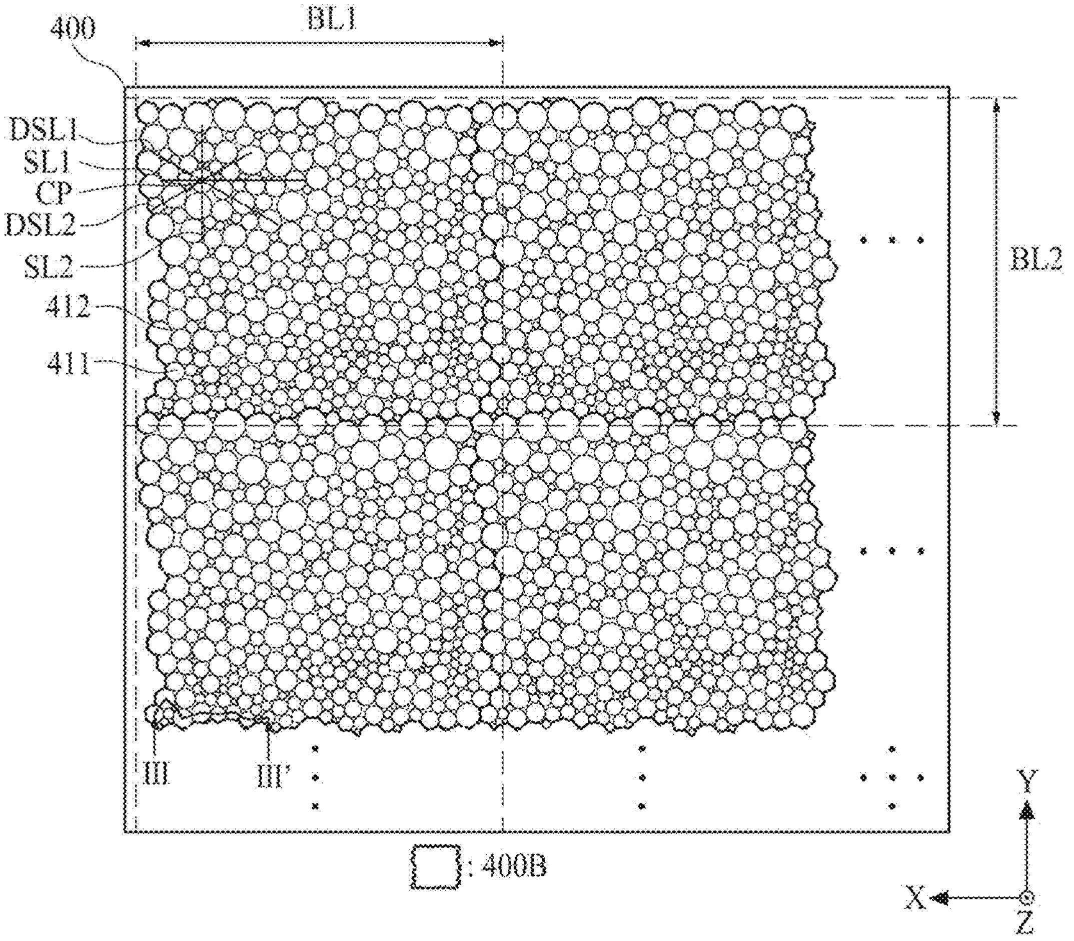
FIG. 11 is a plan view illustrating a light guide member of a foldable display apparatus according to an embodiment of the present disclosure in detail.
Figure 12:
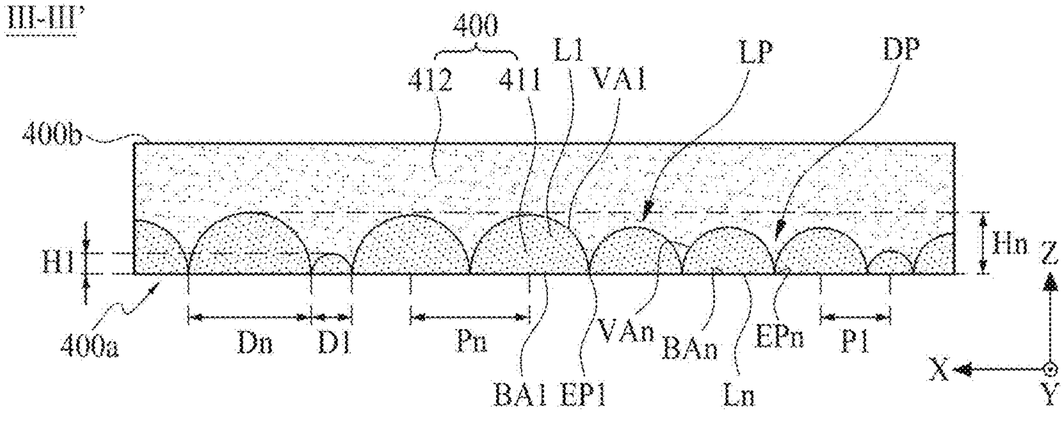
FIG. 12 is a cross-sectional view of an optical guide member of a foldable display apparatus according to an embodiment of the present disclosure. In this case.

FIG. 11 is a plan view illustrating a light guide member of a foldable display apparatus according to an embodiment of the present disclosure in detail. FIG. 12 is a cross-section taken along line III-III' illustrated in FIG. 11.

Hereinafter, the relationship between a plurality of lens patterns L1 to Ln of the refractive layer 411 provided in the light guide member 400 according to an embodiment of the present disclosure will be described with reference to FIGS. 11 and 12. Meanwhile, the relationship between a plurality of lens patterns L1 to Ln of the refractive layer 411 can also be applied to the relationship between the third portion 413*c* of the intermediate layer 413 according to FIGS. 7 and 9 described above, specifically, the relationship between a plurality of lens patterns mL1 to mLn of the third portion 413*c*.

Referring to FIGS. 11 and 12, the light guide member 400 according to an embodiment of the present disclosure can include a refractive layer 411 and a filling layer 412.

As described in FIG. 3, the refractive layer 411 includes a plurality of lens patterns L1 to Ln, and the plurality of lens patterns L1 to Ln includes a material having a first refractive index, and includes an atypical arrangement structure having a hemispherical shape including lower surfaces BA1 to BAn and convex surfaces VA1 to VAn. Therefore, repeated descriptions thereof will be omitted.

The center portions CP of one or more of the plurality of lens patterns L1 to Ln can be spaced apart from at least one of a first straight line SL1, a second straight line SL2, a first diagonal straight line DSL1, and a second diagonal straight line DSL2. For example, the pitches P1 to Pn between two adjacent lens patterns among the plurality of lens patterns L1 to Ln can be different along one or more of a first direction X, a second direction Y, and a diagonal direction between the first direction X and the second direction Y. For example, the plurality of lens patterns L1 to Ln can be configured to have different pitches P1 to Pn along at least one of a first direction X, a second direction Y, and a diagonal direction between the first direction X and the second direction Y.

At least some of the plurality of lens patterns L1 to Ln according to another embodiment of the present disclosure can be disposed to be connected to each other. At least some of the plurality of lens patterns L1 to Ln can be disposed to be non-overlapping and connected to each other. The plurality of lens patterns L1 to Ln can be configured to be non-overlapping and connected to each other along at least one of a first direction X, a second direction Y, and a diagonal direction between the first direction X and the second direction Y. For example, the bottom surfaces BA1 to BAn of each of the plurality of lens patterns L1 to Ln can be connected (or in contact) with the bottom surfaces BA1 to BAn of the lens patterns L1 to Ln adjacent to each other along at least one of a first direction X, a second direction Y, and a diagonal direction between the first direction X and the second direction Y. For example, the ends EP1 to EPn of the lower surfaces BA1 to BAn of each of the plurality of lens patterns L1 to Ln can be connected (or contacted) to the ends EP1 to EPn of the lower surfaces BA1 to BAn adjacent to each other along one or more of the first direction X, the second direction Y, and the diagonal direction between the first direction X and the second direction Y.

Meanwhile, the plurality of lens patterns L1 to Ln can be spaced apart from each other by a predetermined distance. In this case, the ends EP1 to EPn of the bottom surfaces BA1 to BAn of the plurality of lens patterns L1 to Ln may not be connected to the ends EP1 to EPn of the bottom surfaces BA1 to BAn adjacent to each other along at least one of a first direction X, a second direction Y, and a diagonal direction between the first direction X and the second direction Y. In this case, the filling layer 412 can be provided in a region between the plurality of lens patterns L1 to Ln, and thus the filling layer 412 can be in contact with a part of the bottom surface 400*b* of the light guide member 400.

Each of the plurality of lens patterns L1 to Ln can have different diameters D1 to Dn within a range of 1 μm to 60 μm. For example, the plurality of lens patterns L1 to Ln are non-overlapping and connected to each other along at least one of a first direction X, a second direction Y, and a diagonal direction between the first direction X and the second direction Y, and thus can have various diameters D1 to Dn within a range of 1 μm to 60 μm. For example, the refractive layer 411 composed of the plurality of lens patterns L1 to Ln can have a structure in which the plurality of lens patterns L1 to Ln having a relatively small diameter are disposed between the plurality of lens patterns L1 to Ln having a relatively large diameter or filled between the plurality of lens patterns L1 to Ln having a relatively large diameter.

Each of the plurality of lens patterns L1 to Ln can have different heights H1 to Hn. For example, each of the plurality of lens patterns L1 to Ln can have different heights H1 to Hn from the lower surface 400*b* of the light guide member 400.

Each of the plurality of lens patterns L1 to Ln can have different height ratios H/D within a range of 20% to 50%. For example, the plurality of lens patterns L1 to Ln are non-overlapping and connected to each other along at least one of a first direction X, a second direction Y, and a diagonal direction between the first direction X and the second direction Y, and thus can have various height ratios H/D within a range of 20% to 50%.

The light guide member 400 according to an embodiment of the present disclosure can include a plurality of blocks 400B.

The plurality of blocks 400B can be connected to each other along a first direction X and a second direction Y, respectively. For example, the plurality of lens patterns L1 to Ln in the light guide member 400 can be blocked (or grouped) into the plurality of blocks 400B. Accordingly, each of the plurality of blocks 400B can be a pattern block, a refractive pattern block, a guide pattern block, or a guide refractive pattern block.

The plurality of blocks 400B can have the same plurality of lens patterns L1 to Ln. For example, the plurality of lens patterns L1 to Ln in each of the plurality of blocks 400B can be arranged to have a random interval (or an irregular interval) along at least one of a first direction X, a second direction Y, and a diagonal direction between the first direction X and the second direction Y in order to reduce or suppress the occurrence of the rainbow mura and/or the ring pattern and the occurrence of the moire phenomenon. For example, the plurality of lens patterns L1 to Ln can have the same atypical arrangement structure in each of the plurality of blocks 400B. For example, the plurality of lens patterns L1 to Ln can have the same atypical arrangement structure in each of the plurality of blocks 400B. Accordingly, the plurality of lens patterns L1 to Ln in each of the plurality of blocks 400B can be an atypical block pattern, an irregular block pattern, or a non-regular block pattern.

According to an embodiment of the present disclosure, by including the plurality of blocks 400B, a phenomenon in which a sparkle which can be caused by non-uniform contrast differences between the bright parts LP and dark parts DP due to the height difference caused by the plurality of lens patterns L1 to Ln provided in an atypical shape is visually recognized, can be suppressed, prevented or minimized.

Meanwhile, the plurality of blocks 400B can be provided only in the non-folding area (refer to NFA of FIG. 3) in the embodiments of FIGS. 3, 5 and 6, and can be provided in both the folding area and the non-folding area (refer to FA and NFA of FIG. 7) in the embodiments of FIGS. 7 and 9.

The plurality of blocks 400B can be connected to each other along each of the first direction X and the second direction Y. The plurality of lens patterns L1 to Ln can have the same atypical arrangement structure in each of the plurality of blocks 400B. For example, the plurality of lens patterns L1 to Ln can have the same atypical arrangement structure in each of the plurality of blocks 400B. Each of the plurality of blocks 400B can have a first size BL1 in the first direction, e.g., the horizontal direction, and can have a second size BL2 in the second direction, e.g., the vertical direction. In this case, each of the plurality of blocks 400B can have the first size BL1 or the second size BL2 greater than 87 μm and less than or equal to 800 mm.

As described above, the foldable display apparatus according to another embodiment of the present disclosure can include a plurality of blocks 400B having an atypical arrangement structure and including the plurality of lens patterns L1 to Ln connected or spaced apart from each other, thereby improving black visibility characteristics by reflection of external light, realizing real black in a non-driving or off state, and further minimizing, preventing or reducing the occurrence of a moire phenomenon due to interference between the lens pattern and pixels and a sparkle phenomenon due to a difference in contrast due to a lens pattern. Accordingly, the foldable display apparatus according to another embodiment of the present disclosure can have improved image quality, and the viewer's visibility with respect to an image can be further improved.

Accordingly, the present disclosure can have the following advantages.

According to an embodiment of the present disclosure, the light guide member includes a plurality of atypical first lens patterns and includes a first filling layer having a refractive index different from that of the plurality of first lens patterns, and thus Rainbow Mura or Ring Mura can be prevented from occurring due to external light when the foldable display apparatus is not driven.

According to an embodiment of the present disclosure, since an intermediate layer including a continuous area having the same modulus from the top to the bottom of the light guide member is provided in the folding area, even when the folding area is folded, lifting or peeling of the light guide member due to a modulus difference can be prevented or minimized.

According to an embodiment of the present disclosure, since continuous areas having the same modulus from the upper surface to the lower surface of the light guide member are alternately provided in the folding area, the folding area can be flat without lifting or generating curls in a non-folded state.

According to an embodiment of the present disclosure, a plurality of first lens patterns and a first filling layer are provided in the non-folding area, a plurality of second lens patterns are provided on a lower surface of the light guide member in the folding area, a second filling layer having a refractive index different from that of the plurality of second lens patterns is provided on an upper surface of the light guide member, and a modulus difference between the plurality of second lens patterns and the second filling layer in the folding area is formed to be smaller than a modulus difference between the plurality of first lens patterns and the first filling layer in the non-folding area, so that even if the folding area is folded, a lifting phenomenon or peeling phenomenon in the light guide member can be prevented or minimized.

According to an embodiment of the present disclosure, since each of the plurality of blocks includes a plurality of lens patterns and filling layers provided in the same pattern, generation of sparkles due to differences in contrast due to different heights of the plurality of lens patterns arranged irregularly atypically can be suppressed.

It will be apparent to those skilled in the art that various substitutions, modifications, and variations are possible within the scope of the present disclosure without departing from the spirit and scope of the present disclosure. Therefore, the scope of the present disclosure is represented by the following claims, and all changes or modifications derived from the meaning, range and equivalent concept of the claims should be interpreted as being included in the scope of the present disclosure.

What is claimed is:

1. A foldable display apparatus comprising:
a display panel including a folding area and a non-folding area; and
a light guide member disposed on the display panel and including the folding area and the non-folding area,
wherein the light guide member includes:
a plurality of first lens patterns disposed in the non-folding area;
a first filling layer disposed in the non-folding area and disposed on the plurality of first lens patterns; and
an intermediate layer disposed in the folding area,
wherein the intermediate layer includes:
a first portion convex from a lower surface of the light guide member; and
a second portion concave from an upper surface of the light guide member,
wherein a difference between a modulus of the first portion and a modulus of the second portion is smaller than a difference between a modulus of the plurality of first lens patterns and a modulus of the first filling layer.

2. The foldable display apparatus according to claim 1, wherein the modulus of the first portion and the modulus of the second portion are the same.

3. The foldable display apparatus according to claim 1, wherein a refractive index of the first portion and a refractive index of the second portion are different from each other.

4. The foldable display apparatus according to claim 3, wherein a convex surface of the first portion and a concave surface of the second portion correspond to each other.

5. The foldable display apparatus according to claim 3, wherein a difference between a refractive index of the plurality of first lens patterns and a refractive index of the first filling layer is the same as a difference between the refractive index of the first portion and the refractive index of the second portion.

6. The foldable display apparatus according to claim 1, wherein a refractive index of the first lens pattern and a refractive index of the first filling layer are different from each other.

7. The foldable display apparatus according to claim 1, wherein the first lens pattern is arranged in an atypical shape and an irregular arrangement to diffract and/or scatter the external light incident into the foldable display apparatus from the outside based on light refraction principle having a difference in refractive index.

8. The foldable display apparatus according to claim 7, wherein each of the first lens patterns is configured to have a hemispherical shape.

9. The foldable display apparatus according to claim 8, wherein each of the plurality of first lens patterns includes a lower surface corresponding to a portion of a lower surface of the light guide member and a convex surface convexly formed from the lower surface, and at least a part of the first filling layer has a concave surface corresponding to the convex surface.

10. The foldable display apparatus according to claim 1, wherein the folding area includes:
a first area including a portion under maximum stress as the light guide member is folded; and
a second area extending from one side of the first area to the non-folding area, wherein the intermediate layer is disposed in the first area.

11. The foldable display apparatus according to claim 10, wherein the second area of the folding area includes a plurality of second lens patterns and a second filling layer disposed on the plurality of second lens patterns.

12. The foldable display apparatus according to claim 11, wherein the second lens patterns are arranged in an atypical shape and an irregular arrangement.

13. The foldable display apparatus according to claim 11, wherein the refractive index of the second lens pattern and the refractive index of the second filling layer are different from each other.

14. The foldable display apparatus according to claim 11, wherein the first filling layer is continuous with the second filling layer.

15. The foldable display apparatus according to claim 11, wherein at least some of the plurality of first lens patterns and the plurality of second lens patterns have different diameters or different pitches.

16. The foldable display apparatus according to claim 15, wherein some of the plurality of first lens patterns and the plurality of second lens patterns are connected to each other.

17. A foldable display apparatus comprising:
a display panel including a folding and a non-folding areas; and
a light guide member disposed on the display panel and including the folding area and the non-folding area,
wherein the light guide member includes:
a plurality of first lens patterns disposed in the non-folding area;
a first filling layer disposed in the non-folding area and disposed on the plurality of first lens patterns; and
an intermediate layer disposed in the folding area,
wherein the intermediate layer includes a continuous area having a same modulus from an upper surface of the light guide member to a lower surface of the light guide member.

18. The foldable display apparatus according to claim 17, wherein the intermediate layer includes:
a third portion connected from the lower surface to the upper surface of the light guide member; and
a fourth portion connected from the lower surface to the upper surface of the light guide member,
wherein the third portion and the fourth portion are alternately disposed.

19. The foldable display apparatus according to claim 18, wherein a modulus of the third portion and a modulus of the fourth portion are different from each other.

20. The foldable display apparatus according to claim 18, wherein a cross section of the third portion is disposed in a form of triangle.

21. The foldable display apparatus according to claim 18, wherein a cross section of the third portion is disposed in a form of trapezoid.

22. The foldable display apparatus according to claim 17, wherein a refractive index of the first lens pattern and a refractive index of the first filling layer are different from each other.

23. The foldable display apparatus according to claim 17, wherein the first lens pattern is arranged in an atypical shape and an irregular arrangement to diffract and/or scatter the external light incident into the foldable display apparatus from the outside based on light refraction principle having a difference in refractive index.

24. The foldable display apparatus according to claim 23, wherein each of the first lens patterns is configured to have a hemispherical shape.

25. The foldable display apparatus according to claim 24, wherein each of the plurality of first lens patterns includes a lower surface corresponding to a portion of a lower surface of the light guide member and a convex surface convexly formed from the lower surface, and at least a part of the first filling layer has a concave surface corresponding to the convex surfaces.

26. The foldable display apparatus according to claim 17, wherein the folding area includes:

a first area including a portion under maximum stress as the light guide member is folded; and a second area extending from one side of the first area to the non-folding area, wherein the continuous area having a same modulus from the upper surface of the light guide member to the lower surface of the light guide member is disposed in the first area.

27. The foldable display apparatus according to claim 26, wherein the second area of the folding area includes a plurality of second lens patterns and a second filling layer disposed on the plurality of second lens patterns.

28. The foldable display apparatus according to claim 27, wherein the second lens patterns are arranged in an atypical shape and an irregular arrangement.

29. The foldable display apparatus according to claim 27, wherein the refractive index of the second lens pattern and the refractive index of the second filling layer are different from each other.

30. The foldable display apparatus according to claim 27, wherein at least some of the plurality of first lens patterns and the plurality of second lens patterns have different diameters or different pitches.

31. The foldable display apparatus according to claim 30, wherein some of the plurality of first lens patterns and the plurality of second lens patterns are connected to each other.

* * * * *